United States Patent
Zhong et al.

(10) Patent No.: US 8,227,819 B2
(45) Date of Patent: *Jul. 24, 2012

(54) THIN P-TYPE GALLIUM NITRIDE AND ALUMINUM GALLIUM NITRIDE ELECTRON-BLOCKING LAYER FREE GALLIUM NITRIDE-BASED LIGHT EMITTING DIODES

(75) Inventors: Hong Zhong, Temple City, CA (US); Anurag Tyagi, Goleta, CA (US); James Stephen Speck, Goleta, CA (US); Steven P. Denbaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/250,558

(22) Filed: Sep. 30, 2011

(65) Prior Publication Data

US 2012/0037884 A1 Feb. 16, 2012

Related U.S. Application Data

(63) Continuation of application No. 12/611,063, filed on Nov. 2, 2009, now Pat. No. 8,044,383.

(60) Provisional application No. 61/111,642, filed on Nov. 5, 2008.

(51) Int. Cl.
*H01L 33/00* (2010.01)

(52) U.S. Cl. ............ 257/94; 257/103; 257/13; 257/14; 257/E33.034; 438/47

(58) Field of Classification Search ............ 257/94, 257/103, 13, 14, E33.034; 438/47
See application file for complete search history.

(56) References Cited

U.S. PATENT DOCUMENTS

| | | | |
|---|---|---|---|
| 8,044,383 B2 * | 10/2011 | Zhong et al. | 257/13 |
| 2005/0214992 A1 | 9/2005 | Chakraborty et al. | |
| 2007/0252164 A1 | 11/2007 | Zhong et al. | |
| 2008/0232416 A1 | 9/2008 | Okamoto et al. | |
| 2008/0308906 A1 | 12/2008 | Osada et al. | |

FOREIGN PATENT DOCUMENTS

WO 2007/098215 8/2007

OTHER PUBLICATIONS

Bernardini, F. et al., "Spontaneous versus piezoelectric polarization in III-V nitrides: conceptual aspects and practical consequences," Phys. Stat. Sol. (b) 216, 391, 1999, pp. 391-398.
Blom, P. et al., "Carrier capture into a semiconductor quantum well," Physical Review B, vol. 47, No. 4, Jan. 15, 1993, pp. 2072-2081.
Chen, C. et al., "A new selective area lateral epitaxy approach for depositing a-plane GaN over r-plane sapphire," Jpn. J. Appl. Phys., vol. 42, 2003, pp. L818-L820.

(Continued)

*Primary Examiner* — Tu-Tu Ho
(74) *Attorney, Agent, or Firm* — Gates & Cooper LLP (57) ABSTRACT

A light emitting diode (LED) having a p-type layer having a thickness of 100 nm or less, an n-type layer, and an active layer, positioned between the p-type layer and the n-type layer, for emitting light, wherein the LED does not include a separate electron blocking layer.

14 Claims, 4 Drawing Sheets

OTHER PUBLICATIONS

Chichibu, S. et al., "Spontaneous emission of localized excitons in InGaN single and multiquantum well structures," Appl. Phys. Lett. 69 (27), Dec. 30, 1996, pp. 4188-4190.

Fujita, A. et al., "Active magnetic regeneration behavior of spherical hydrogenated La(Fe0.86Si0.14)13 fabricated by rotating electrode process," Japanese Journal of Applied Physics, vol. 46, No. 8, 2007, pp. L154-L156.

Funato, M., "Blue, green and amber InGan/GaN light-emitting diodes on semipolar {11-22} GaN bulk substrates," Japanese Journal of Applied Physics, vol. 45, No. 26, 2006, pp. L659-L662.

Lee, Y. et al., "Nondegenerate coherent control of polariton modes in quantum-well semiconductor microactivity," Phys. Stat. Sol. (b) 221, 121 (2000), pp. 121-126.

Levetas, S. et al., "Calculation of capture of carriers by quantum wells," Physical Review B, vol. 59, No. 15, Apr. 15, 1999, pp. 10202-10207.

Mukai, T. et al., "Current and temperature dependences of electroluminescence of InGaN-based UV/blue/green light-emitting diodes," Jpn. J. Appl. Phys., vol. 37, 1998, L1358-L1361.

Masui, H. et al., "First-moment analysis of polarized light emission from InGaN/GaN light-emitting diodes prepared on semipolar planes," Japanese Journal of Applied Physics, vol. 45, No. 34, 2006, pp. L904-L906.

Masui, H. et al., "Light-polarization characteristics of electroluminescence from InGaN/GaN light-emitting diodes prepared on (1122)-plane GaN," Journal of Applied Physics 100, 2006, pp. 113109-1-113109-5.

Miller, P., "Seoul Semiconductor squeezes 240 lumens into 'brightest' LED," http://www.engadget.com/2006/12/12/seoul-semiconductor-squeezes-240-lumens-into-brightest-led, 2006, one page.

Nakamura, S. et al., "High-brightness InGaN blue, green and yellow light-emitting diodes with quantum well structures," Jpn. J. Appl. Phys., vol. 34, 1995, pp. L797-L799.

Romanov, A. et al., "Strain-induced polarization in wurzite III-nitride semipolar layers," Journal of Applied Physics 100, 2006, pp. 023522-1-023522-10.

Sato, H. et al., "High power and high efficiency green light emitting diode on free-standing semipolar (1122) bulk GaN substrate," Phys. Stat. Sol. (RRL) 1, No. 4, 2007, pp. 162-164.

Sharma, R. et al., "Demonstration of a semipolar (1013) InGaN/GaN green light emitting diode," Applied Physics Letters 87, 2005, pp. 231110-1-231110-3.

Tyagi, A. et al., "High brightness violet InGaN/GaN light emitting diodes on semipolar (1011) bulk GaN substrates," Japanese Journal of Applied Physics, vol. 46, No. 7, 2007, pp. L129-L131.

Waltereit, P. et al., "Nitride semiconductors free of electrostatic fields for efficient white light-emitting diodes," Nature, vol. 406, Aug. 24, 2000, pp. 865-868.

Zhong, H. et al., "High power and high efficiency blue light emitting diodes on freestanding semipolar (1011) bulk GaN substrate," Applied Physics Letters 90, 2007, pp. 233504-1-233504-3.

Zhong, H. et al., "Thin p-type GaN and AlGaN electron-blocking layer free blue semipolar (1011) nitride-based light emitting diodes (LEDs)," 2008, six pages.

International Search Report mailed Dec. 29, 2009, International application No. PCT/US2009/063012, International filing date Nov. 2, 2009.

Zhong, H. et al., "Demonstration of high power blue-green light emitting diode on semipolar (1122) bulk GaN substrate", Electronics Letters, vol. 43, No. 15, Jul. 19, 2007, pp. 825-827.

* cited by examiner

*Figure 4*

THIN P-TYPE GALLIUM NITRIDE AND ALUMINUM GALLIUM NITRIDE ELECTRON-BLOCKING LAYER FREE GALLIUM NITRIDE-BASED LIGHT EMITTING DIODES

CROSS-REFERENCE TO RELATED APPLICATIONS

This application is a continuation of and commonly-assigned U.S. Utility application Ser. No. 12/611,063, filed on Nov. 2, 2009, by Hong Zhong, Anurag Tyagi, James S. Speck, Steven P. DenBaars, and Shuji Nakamura, entitled "THIN P-TYPE GALLIUM NITRIDE AND ALUMINUM GALLIUM NITRIDE ELECTRON-BLOCKING LAYER FREE GALLIUM NITRIDE-BASED LIGHT EMITTING DIODES," now U.S. Pat. No. 8,044,383, issued Oct. 25, 2011, which application claims the benefit under 35 U.S.C. Section 119(e) of co-pending and commonly-assigned U.S. Provisional Application Ser. No. 61/111,642 filed on Nov. 5, 2008, by Hong Zhong, Anurag Tyagi, James S. Speck, Steven P. DenBaars, and Shuji Nakamura, entitled "THIN P-TYPE GALLIUM NITRIDE AND ALUMINUM GALLIUM NITRIDE ELECTRON-BLOCKING LAYER FREE GALLIUM NITRIDE-BASED LIGHT EMITTING DIODES," both of which applications are incorporated by reference herein.

This application is related to the following co-pending and commonly-assigned U.S. patent applications:

U.S. Utility patent application Ser. No. 12/370,479, filed on Feb. 12, 2009, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION," which application is a continuation under 35 U.S.C. §120 of U.S. Utility patent application Ser. No. 11/621,479, filed on Jan. 9, 2007, now U.S. Pat. No. 7,504,274 issued Mar. 17, 2009, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION," which application is a continuation under 35 U.S.C. §120 of U.S. Utility patent application Ser. No. 11/123,805, filed on May 6, 2005, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION," now U.S. Pat. No. 7,186,302, issued on Mar. 6, 2007, which application claims the benefit under 35 U.S.C. §119(e) of U.S. Provisional Patent Application Ser. No. 60/569,749, filed on May 10, 2004, by Arpan Chakraborty, Benjamin A. Haskell, Stacia Keller, James S. Speck, Steven P. DenBaars, Shuji Nakamura and Umesh K. Mishra, entitled "FABRICATION OF NON-POLAR InGaN THIN FILMS, HETEROSTRUCTURES AND DEVICES BY METALORGANIC CHEMICAL VAPOR DEPOSITION,"

U.S. Utility patent application Ser. No. 11/621,482, filed on Jan. 9, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,704,331, issued Apr. 27, 2010, which application is a continuation under 35 U.S.C. §120 of U.S. Utility patent application Ser. No. 11/372,914, filed on Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,220,324, issued on May 22, 2007, which application claims the benefit under 35 U.S.C. §119(e) of U.S. Provisional Patent Application Ser. No. 60/660,283, filed on Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," and U.S. Utility patent application Ser. No. 11/852,908, filed on Sep. 10, 2007, by Michael D. Craven and James S. Speck, entitled "NON-POLAR A-PLANE GALLIUM NITRIDE THIN FILMS GROWN BY METALORGANIC CHEMICAL VAPOR DEPOSITION," which application is a continuation-in-part of:

U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, which application claims the benefit under 35 U.S.C. §119(e) of U.S. Provisional Patent Application Ser. No. 60/372,909, filed on Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS," and U.S. Utility patent application Ser. No. 11/472,033, entitled "NON-POLAR (Al, B, In, Ga)N QUANTUM WELL AND HETEROSTRUCTURE MATERIALS AND DEVICES," now U.S. Pat. No. 7,982,208, issued Jul. 19, 2011, filed on Jun. 21, 2006, by Michael D. Craven, Stacia Keller, Steven P. DenBaars, Tal Margalith, James S. Speck, Shuji Nakamura, and Umesh K. Mishra, which application is a divisional application and claims the benefit under 35 U.S.C. §120 and §121 of U.S. Utility patent application Ser. No. 10/413,690, filed on Apr. 15, 2003, by Michael D. Craven et al., entitled "NON-POLAR (Al, B, In, Ga)N QUANTUM WELL AND HETEROSTRUCTURE MATERIALS AND DEVICES," now U.S. Pat. No. 7,091,514, issued on Aug. 15, 2006, which application claims the benefit under 35 U.S.C. §119(e) of U.S. Provisional Patent Application Ser. No. 60/372,909, filed on Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,"

all of which applications are incorporated by reference herein.

BACKGROUND OF THE INVENTION

1. Field of the Invention

This invention relates to light emitting diodes (LEDs) and in particular to high efficiency and high brightness LEDs for various lighting applications, and methods of fabricating the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Gallium nitride (GaN)-based wide band gap semiconductor light emitting diodes (LEDs) have been available for almost 15 years. The progress of LED development has brought about great changes in LED technology, with the realization of full-color LED displays, LED traffic signals, white LEDs and so on.

Highly efficient white LEDs have gained much interest as possible replacements for fluorescent lamps. For example, the luminous efficacy of white LEDs (130-150 lumens/watt [1]) already surpasses that of ordinary fluorescent lamps (75 lumens/watt.) Nevertheless, current commercially available wurtzite nitride-based LEDs are characterized by the presence of polarization-related electric fields inside multi-quantum wells (MQWs), for their [0001] c-polar growth orientation. The discontinuities in both spontaneous and piezoelectric polarization at the heterointerfaces result in internal electric fields in quantum wells which cause carrier separation (quantum confined Stark effect (QCSE)) and reduce the radiative recombination rate within quantum wells [2-5]. To maintain a decent radiative recombination rate, c-polar light emitting devices typically have thin (<3 nm) quantum wells [6-7].

To decrease these polarization-related effects, growing III-nitride devices on the non-polar planes (viz, the (1-100) m-plane or the (11-20) a-plane) has been demonstrated [8-9]. Another approach to reduce, and possibly eliminate, those effects is to grow III-nitride devices on crystal planes that are inclined with respect to the c-direction, i.e., semi-polar planes. These planes have reduced polarization discontinuity in heterostructures, compared with the c-plane III-nitride materials; and for semi-polar planes oriented ~45° from the c-plane, there is no polarization discontinuity in InGaN/GaN heterostructures [5]. With reduced polarization-related electric fields inside the quantum well region, the electron and hole wavefunctions inside a semi-polar-oriented InGaN quantum well are expected to have more overlap (and thus lead to a higher radiative efficiency) than in a c-polar oriented counterpart, for a given quantum well thickness. In other words, without worrying about the detrimental effect on the radiative recombination rate, one can employ thick quantum well designs in semi-polar LEDs. Devices grown on different semi-polar planes (including (10-1-1), (10-1-3), (11-22) planes etc.) have been demonstrated and they exhibited greatly reduced polarization-related electric fields [10-12]. The output powers of those heteroepitaxially-grown devices, however, suffer from the presence of stacking faults and threading dislocations. Recently, with the advent of high quality freestanding GaN substrates, high performance non-polar and semi-polar LEDs with peak emission wavelengths ranging from 407 nm to 513 nm on non-polar m-plane, semi-polar (10-1-1), and (11-22) freestanding GaN substrates have been reported [13-17]. Nonetheless, the output powers of those devices are still lower than that of typical the-state-of-the-art c-polar devices, which can be partly attributed to the un-optimized LED epitaxial layer structure.

This invention presents novel semi-polar LED epitaxial layer structures that are expected to address this problem.

SUMMARY OF THE INVENTION

To overcome the limitations in the prior art described above, and to overcome other limitations that will become apparent upon reading and understanding the present invention, the present invention comprises of a novel approach for producing a GaN-based semi-polar-oriented light emitting diode (LED) that contains a thin (i.e. <100 nanometers (nm)) p-type GaN layer and no AlGaN electron-blocking layer (EBL). In the preferred embodiment, freestanding semi-polar (10-1-1) GaN is used as the substrate for the LED. This invention offers several advantages over the existing semi-polar LEDs. First of all, the thin p-type GaN layer and AlGaN EBL free designs can lower series-resistance and thus the operating voltage of a GaN-based LED. Additionally, the thin p-type GaN layer may reduce the absorption of light emitted from the quantum well region. Furthermore, the hole-carrier injection efficiency is likely to benefit from the removal of the AlGaN EBL.

In one embodiment an LED, comprises a p-type layer having a thickness of 100 nm or less; an n-type layer; and an active layer, positioned between the p-type layer and the n-type layer, for emitting light; wherein the p-type layer, n-type layer and active layer are comprised of semi-polar nitride based material. For example, the p-type layer may have a thickness of at most 50 nm. The LED may be III-nitride based but not contain an AlGaN electron blocking layer, for example.

The active layer may comprise one or more quantum wells having a thickness of 4 nm or more, wherein the active layer/quantum wells have a thickness thick enough, and a composition, to capture and confine electron-carriers in the active layer, thereby providing the function of an electron blocking layer. The quantum wells may be InGaN quantum wells, for example.

The LED of the present invention may have a higher luminous efficiency, crystal quality, hole injection efficiency, lower series-resistance, operating voltage, and light absorption as compared to an LED comprising a separate AlGaN blocking layer and thicker p-type layer.

The present invention further discloses a method for fabricating an LED, comprising depositing an n-type layer on a substrate; depositing an active layer for emitting light on the n-type layer (e.g., growing one or more InGaN quantum wells to a thickness greater than 4 nm and to a thickness and with a composition that captures and confines electron-carriers in the active layer, thereby providing the function of an electron blocking layer); and depositing a p-type layer on the active layer, to a thickness of 100 nm or less (e.g., to a thickness of at most 50 nm); wherein the p-type layer, n-type layer and active layer are comprised of semi-polar nitride based material.

BRIEF DESCRIPTION OF THE DRAWINGS

Referring now to the drawing in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of this invention is to generate semi-polar-oriented GaN-based LEDs with improved performance and manufacturability. The proposed device will typically be used as an optical source for various display, illumination, and solid-state lighting applications.

The realization of thin p-type GaN and AlGaN EBL free LED structures would potentially allow for multiple advances in the manufacturability of GaN-based LEDs (because this invention further simplifies LED epitaxial structure) and yield devices with reduced voltage operation and higher crystal quality. The semi-polar GaN platforms are expected to offer performance advantages such as devices with higher radiative recombination rate and thus higher internal quantum efficiency. These advantages will potentially lower the cost of a variety of commercial products.

Nomenclature

The term "(Al, Ga, In)N" or III-Nitride as used herein is intended to be broadly construed to include respective nitrides of the single species, Al, Ga, and In, as well as binary, ternary and quaternary compositions of such Group III metal species. Accordingly, the term (Al, Ga, In)N comprehends the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in reference to GaN materials is applicable to the formation of various other (Al, Ga, In)N material species. Further, (Al, Ga, In)N materials within the scope of the invention may further include minor quantities of dopants and/or other impurity or inclusional materials.

Technical Description

This invention is a semiconductor LED comprised of alloys such as, but not limited to, (Ga, In, Al)N. In comparison to the other semi-polar LEDs reported thus far, whose p-type GaN thicknesses range from 150 nm to 200 nm [14-18], the proposed devices contain a thinner p-type GaN layer (i.e. <100 nm and a typical value of 50 nm). Moreover, unlike previously reported semi-polar LEDs [14-18], the proposed devices contain no AlGaN electron-blocking layer (EBL), which is typically sandwiched between the quantum well region and the p-type GaN layer. The device is grown and processed using well-established semiconductor device fabrication techniques.

Figure 1A:
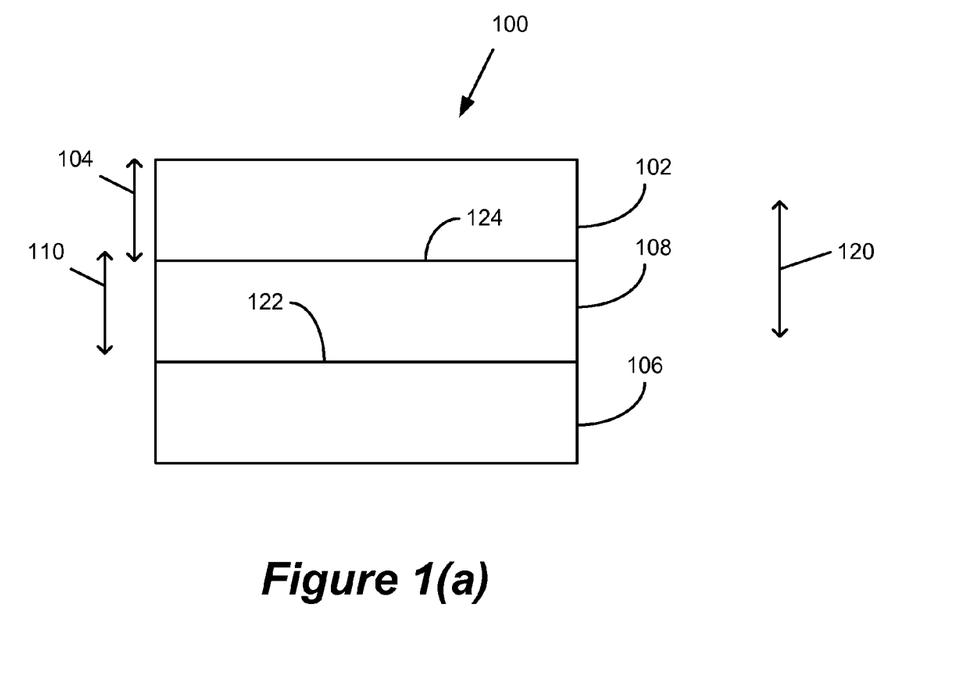
FIG. 1(a) is a cross-sectional schematic of an LED according to one embodiment of the present invention.

FIG. 1(a) illustrates a device 100 (e.g., LED) according to the present invention, comprising a p-type layer 102 having a thickness 104 of 100 nm or less (e.g., at most 50 nm); an n-type layer 106; and an active region or layer 108, positioned between the p-type layer 102 and the n-type layer 106, for emitting light. The active layer 108 typically, although not necessarily, has a thickness 110 thick enough, and a composition, to capture and confine electron-carriers in the active layer 108, thereby providing the function of an EBL. Thus, the present invention may integrate the EBL and active layer 108 as one layer 108 providing both light emitting and electron blocking functionality. Thus, in one embodiment, the LED 100 does not include a separate EBL (distinct from layers 102, 106, 108) grown specifically for the sole purpose of electron blocking. For example, the LED 100 typically does not contain an AlGaN blocking layer.

As a result, the LED may have a higher luminous efficiency, crystal quality, hole injection efficiency, lower series-resistance, operating voltage, and light absorption as compared to an LED comprising a separate AlGaN blocking layer and thicker p-type layer.

The LED is typically III-Nitride based, e.g., layers 102, 106, and 108 are III-Nitride (Al, In, Ga)N layers.

Figure 1B:
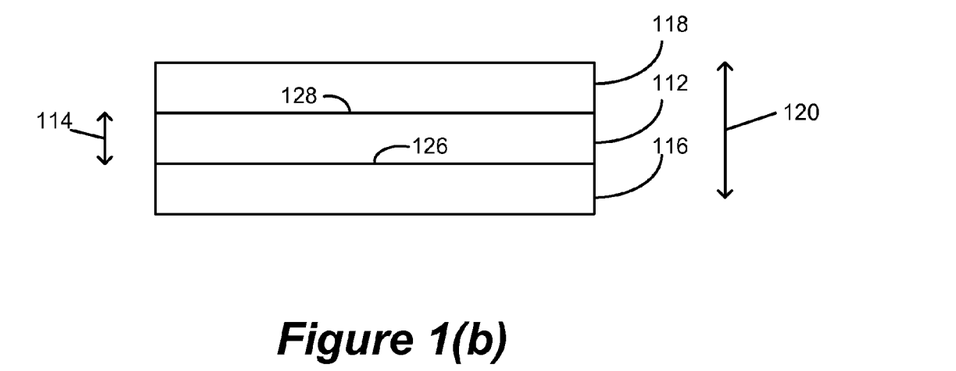
FIG. 1(b) is a cross-sectional schematic of an example of an active region of the present invention.

As shown in FIG. 1(b), the active layer 108 may comprise one or more quantum wells 112 having a thickness 114 of 4 nm or more, and a composition (e.g., InGaN) to emit light. In addition, the active layer 108 may comprise one or more quantum wells 112 having the composition and the thickness 114 to capture and confine electron-carriers in the quantum well 112, thereby providing the function of an electron blocking layer. The quantum wells 112 (e.g., InGaN) are typically sandwiched between a first quantum well barrier 116 (e.g., GaN) and a second quantum well barrier 118 (e.g., GaN). The electron carriers typically flow to the active layer 108 and quantum wells 112, in response to a power source, and recombine with holes in the active layer 108 and quantum wells 112, to generate the light emitted by the device 100.

The LED 100 typically has a semi-polar or non-polar orientation 120, for example, layers 102, 106, and 108 are grown along a non-polar or semi-polar orientation 120, or cut, such that the interface 122 between the active layer 108 and the n-type layer 106 and the interface 124 between the active layer 108 and p-type layer 102 are a selected non-polar or semi-polar plane. The interface 126 between the quantum well 112 and first barrier 116 and the interface 128 between the quantum well 112 and the second barrier 118 are also the selected non-polar or semi-polar plane(s). The semi-polar or non non-polar orientation 120 is typically along the quantum confinement direction (the direction along which the electrons and holes in the quantum well 112 are confined by the energy barrier provided by the barrier layers 116, 118), so that the QCSE is reduced as compared to a c-plane device.

In one embodiment, all the layers, e.g., the p-type layer 102, n-type layer 106, and active layer 108 are comprised of semi-polar nitride based material.

Figure 2:
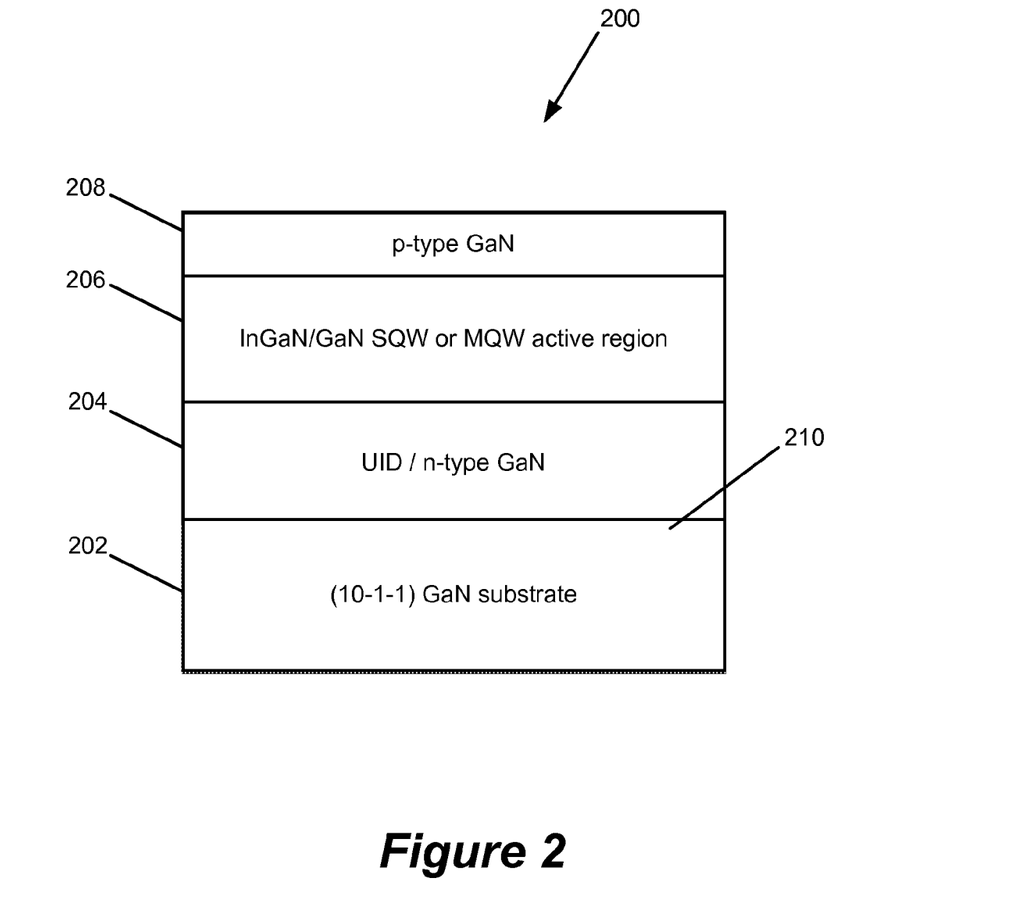
FIG. 2 is a schematic cross-section of another example of an epitaxial layer structure for a thin p-type GaN layer and AlGaN EBL-free semi-polar LED, comprising an InGaN/GaN MQW or single quantum well (SQW).

FIG. 2 shows a typical epitaxial layer structure 200 for the proposed device. This is one embodiment of the invention. Other epitaxial structures are possible and several alternative embodiments will be suggested in the following sections. As a first example, a device 200 is grown on a semi-polar (10-1-1) freestanding GaN substrate 202, starting with an unintentionally doped (UID) and/or n-type GaN layer 204, followed by a quantum well region 206 that may contain an InGaN/GaN SQW or MQWs, followed by a thin p-type GaN layer 208. Given the device's semi-polar orientation, the individual quantum well thickness could be thicker than what is typically used for c-polar devices (i.e. >4 nm). The (10-1-1) freestanding GaN substrate 202 has a surface 210 upon which layer 204 is epitaxially grown that is a semi-polar (10-1-1) plane.

Figure 3:
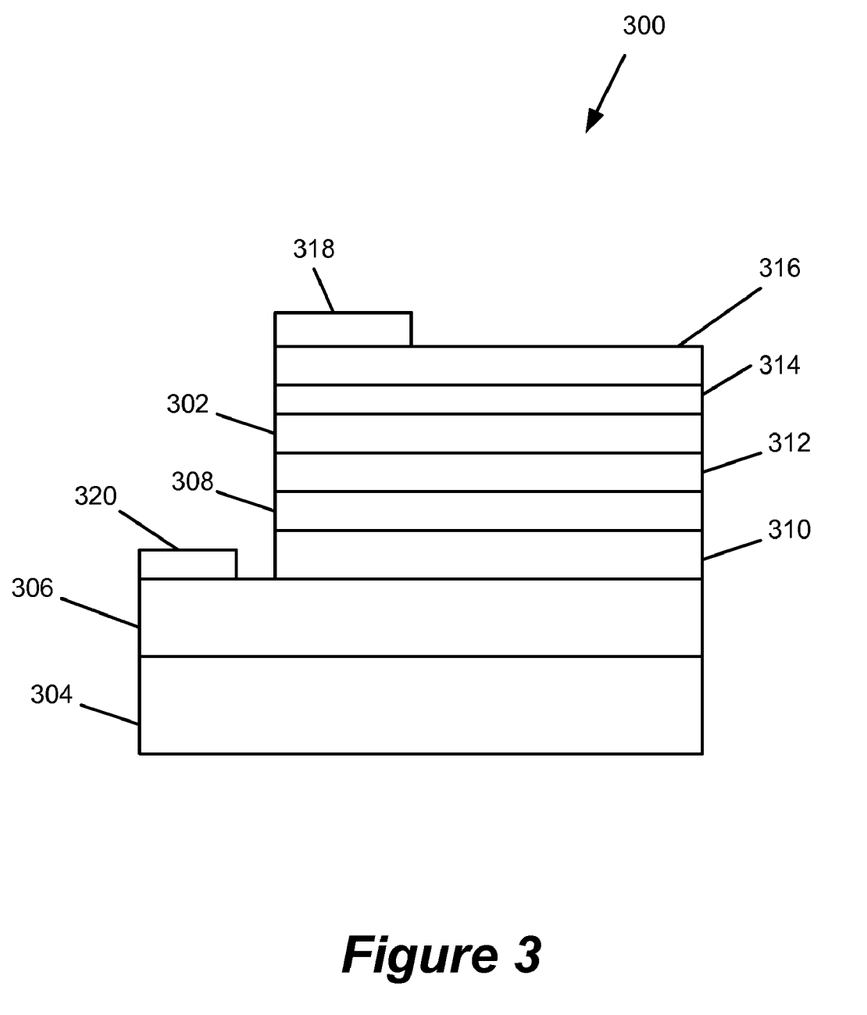
FIG. 3 is a schematic cross-section of yet another example of an LED according to the present invention.

FIG. 3 shows a second example of a semi-polar LED device 300 with a thin p-type GaN layer 302, and no AlGaN EBL, that was grown by metal organic chemical vapor deposition (MOCVD) on a freestanding semi-polar (10-1-1) GaN substrate 304. The LED epitaxial layer structure includes a 1.0 μm thick silicon-doped n-type GaN 306, active region comprising a 3 nm thick quantum well 308 and 30 nm thick UID GaN barriers 310, 312, 30 nm thick magnesium (Mg)-doped p-type GaN layer 302 and a 20 nm thick heavily Mgdoped p+-type GaN contact layer 314. Following the growth, LEDs were fabricated and packaged on silver headers. 250 nm thick indium-tin-oxide (ITO) was used as the p-type GaN contacts 316 and Ti/Au was used as the p-type and n-type electrodes 318, 320. A representative LED 300 was tested on a bare header (without any encapsulation and without any intentional light extraction scheme) in an integrating sphere under Direct Current (DC) operation. At 20 milliamps (mA) drive current, a peak-emission wavelength of 444 nm and an output power of 15.2 milliwatts (mW) was measured. In comparison, the output power of the best semi-polar blue LED described in the literature [15], on a bare silver header (without any encapsulation and without any intentional light extraction scheme), and measured in an integrating sphere, was only 11.6 mW at 20 mA under DC operation. It should be noted that except for the thick (200 nm) p-type GaN layer and AlGaN EBL, this semi-polar LED (described in [15]) is almost identical to the second example of the present invention, including the peak EL emission wavelength, crystal orientation, quantum well thickness, and ITO p-contact thickness.

The implementation of the proposed epitaxial structure to produce various categories of GaN-based LEDs is the core of the invention. This epitaxial structure may be fabricated into a variety of Thin P-type GaN layer and AlGaN EBL Free semi-polar (TPAF) LEDs using standard semiconductor processing techniques.

There are multiple applications and variations on the invention, as discussed in the sections above and below.

Process Steps

Figure 4:
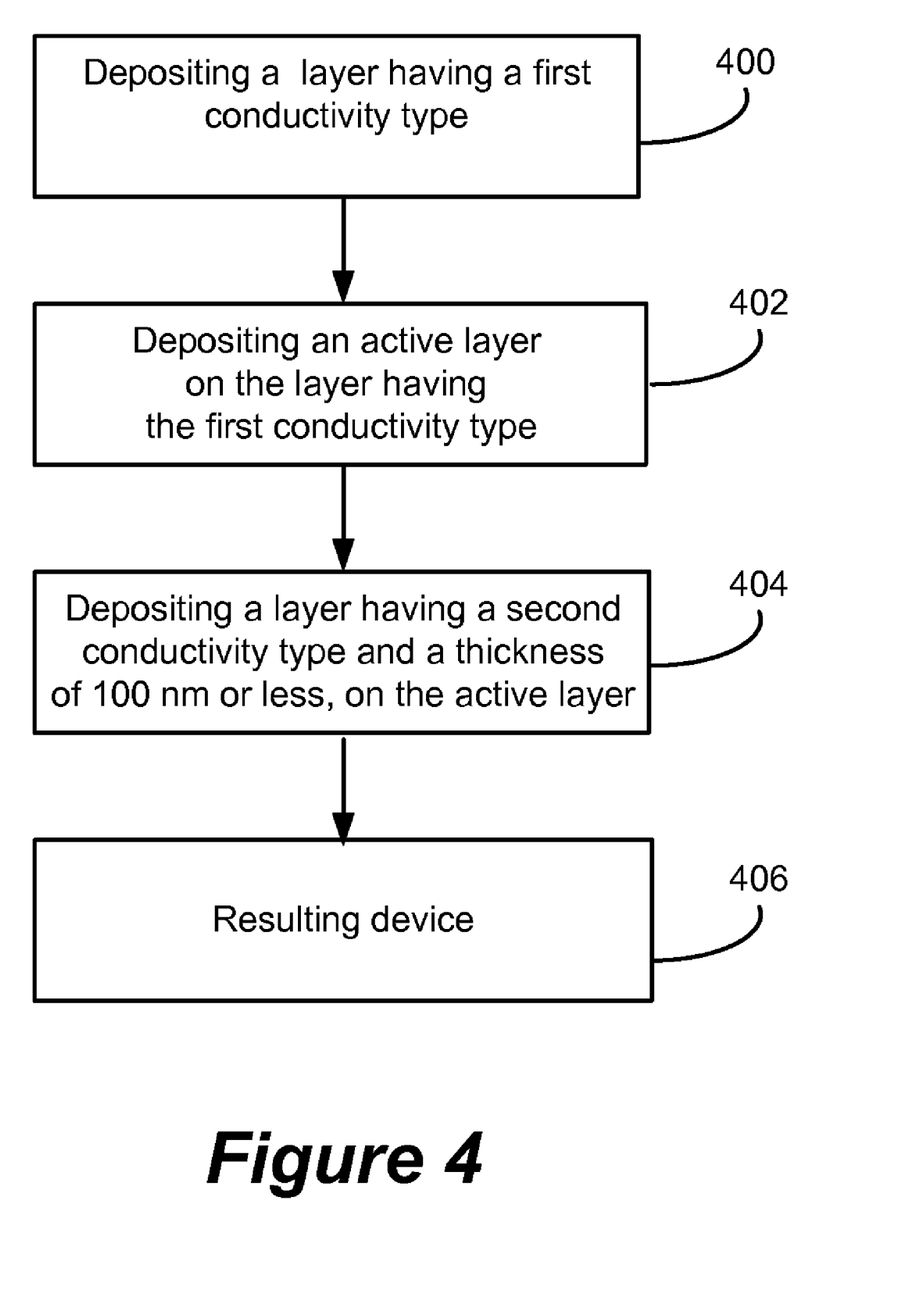
FIG. 4 is a flowchart illustrating a method of the present invention.

FIG. 4 illustrates a method for fabricating an LED, comprising the following steps.

Block 400 represents depositing (e.g., growing) a layer having a first conductivity type (e.g., n-type layer) on a substrate, e.g., on a non-polar or semi-polar substrate or on a non-polar or semi-polar plane of a substrate, or on a substrate that supports semi-polar or non-polar growth. The n-type layer may be grown, for example, along a non-polar or semi-polar orientation of III-Nitride.

Block 402 represents depositing (e.g., growing) an active layer or region, for emitting light, on the layer of block 400 having the first conductivity type. In one example, depositing the active layer comprises growing one or more quantum wells having a thickness of 4 nm or more. Furthermore, the method typically, although not necessarily, comprises depositing the active layer to a thickness and with a composition that captures and confines electron-carriers, thereby providing the function of an electron blocking layer. For example, depositing the active layer may comprise growing one or more quantum wells having the thickness and composition that captures and confines electron-carriers. The quantum wells may be grown as InGaN quantum wells.

Thus, a separate electron blocking layer, such as an AlGaN blocking layer, need not be included in the LED.

The active layer is typically along a non-polar or semi-polar orientation of III-Nitride, on a non-polar or semi-polar plane of the layer having the first conductivity type grown in block 400.

Block 404 represents depositing (e.g., growing) a layer having a second conductivity type (e.g., p-type layer) and a thickness of 100 nm or less, on the active layer of block 402. In one example, the step comprises depositing the p-type layer to a thickness of at most 50 nm. The p-type layer may be grown, for example, along a non-polar or semi-polar orientation of III-Nitride.

Block 406 represents the end result of the method, a device such as an LED. The p-type layer, the active layer, and the n-type layer are typically III-nitride and the LED typically does not contain an AlGaN electron blocking layer, for example. All layers, e.g., the p-type layer, n-type layer and active layer, may be comprised of semi-polar nitride based material. The depositing steps (a), (b), and (c) may result in a higher luminous efficiency, crystal quality, hole injection efficiency, lower series-resistance, operating voltage, and light absorption as compared to an LED comprising a separate AlGaN blocking layer and thicker p-type layer.

Possible Modifications

Growth of TPAF LEDs may also be practiced on (Ga, In, Al)N crystal orientations other than the semi-polar (10-1-1) plane, including but not limited to, all other semi-polar planes, and non-polar a-planes and m-planes. The term "semi-polar plane" can be used to refer to any plane that cannot be classified as c-plane, a-plane, or m-plane. In crystallographic terms, a semi-polar plane would be any plane that has at least two nonzero h, i, or k Miller indices and a nonzero l Miller index. Non-polar m-planes and a-planes refer to (10-10) and (11-20) planes, respectively.

The preferred embodiment presented above discussed (Ga, Al, In)N thin films, heterostructures, and devices grown on a free-standing semi-polar nitride wafer having a composition lattice matched to the structure to be grown. Freestanding semi-polar nitride wafers may be created by removing a foreign substrate from a thick semi-polar nitride layer, by sawing a bulk nitride ingot or boule into individual semi-polar nitride wafers, or by any other possible crystal growth or wafer manufacturing technique. The scope of this invention includes the growth and fabrication of semi-polar (Ga, Al, In)N thin films, heterostructures, and devices on all possible freestanding semi-polar nitride wafers created by all possible crystal growth methods and wafer manufacturing techniques. The substrate may also be thinned and/or polished and/or removed in some instances.

Likewise, the (Ga, Al, In)N thin films, heterostructures, and devices discussed above could be grown on a freestanding non-polar nitride wafer having a composition lattice matched to the structure to be grown. Freestanding non-polar nitride wafers may be created by removing a foreign substrate from a thick non-polar nitride layer, by sawing a bulk nitride ingot or boule into individual non-polar nitride wafers, or by any other possible crystal growth or wafer manufacturing technique. The scope of this invention includes the growth and fabrication of non-polar (Ga, Al, In)N thin films, heterostructures, and devices on all possible freestanding non-polar nitride wafers created by all possible crystal growth methods and wafer manufacturing techniques. The substrate may also be thinned and/or polished in some instances.

Moreover, foreign substrates other than freestanding GaN could be used for semi-polar or non-polar template growth. The scope of this invention includes the growth and fabrication of semi-polar and non-polar (Ga, Al, In)N thin films, heterostructures, and devices on all possible crystallographic orientations of all possible substrates. These substrates include, but are not limited to, silicon carbide, gallium nitride, silicon, zinc oxide, boron nitride, lithium aluminate, lithium niobate, germanium, aluminum nitride, lithium gallate, partially substituted spinels, and quaternary tetragonal oxides sharing the $\gamma$-LiAlO$_2$ structure.

The semi-polar (Ga, Al, In)N devices described above were grown on freestanding GaN wafers. However, the scope of this invention also covers non-polar or semi-polar (Ga, Al, In)N devices grown on non-polar or semi-polar epitaxial laterally overgrown (ELO) templates. The ELO technique is a method of reducing the density of threading dislocations (TD) in subsequent epitaxial layers. Reducing the TD density leads to improvements in device performance.

Variations in (Ga, In, Al)N quantum well and heterostructure design are possible without departing from the scope of the present invention. For example, low aluminum composition AlGaN layers ($Al_xGaN_{1-x}N$, $0 \leq x \leq 0.5$), as well as AlInGaN quaternary layers, could be used as quantum well barriers. Moreover, the specific thickness and composition of the layers, the number of quantum wells grown, and the inclusion are variables inherent to particular device designs and may be used in alternative embodiments of the present invention.

This invention may also be used to produce TPAF GaN-based LEDs that do not contain quantum wells. One example is an LED structure containing a GaN/InGaN double heterostructure.

Advantages and Improvements

This invention offers several advantages over the existing semi-polar LEDs. A thin p-type GaN and AlGaN-EBL-free semi-polar LED is expected to have a higher luminous efficacy. This is because the thin p-type GaN layer and absence of AlGaN EBL can lower series-resistance and thus the operating voltage of a GaN-based LED. Additionally, the thin p-type GaN layer may reduce the absorption of light emitted from the quantum well region. Furthermore, the hole-carrier injection efficiency is likely to benefit from the removal of the AlGaN EBL, since while AlGaN EBL enhances capture and confinement of the electron-carriers in the quantum well active region, it also obstructs hole-carrier injection [19]. Instead of the AlGaN EBL, thick quantum well designs facilitated by the semi-polar growth orientation can be utilized to help the capture and confinement of the electron-carriers (a thick quantum well is expected to be more efficient in capturing and confining electron-carriers [20-22]).

The implementation of the present invention is also expected to result in higher LED crystal quality. This is because a thin p-type GaN layer (which is preferably grown at a much higher temperature than the InGaN quantum well growth temperature) requires a shorter growth time, which in turn shortens the high temperature exposure for the InGaN quantum well region, alleviating the possible deterioration of InGaN quantum well region due to high temperature. Furthermore, the absence of AlGaN EBL layer is expected to improve the overall epitaxial layer crystal quality since this AlGaN layer is typically grown at a temperature around the InGaN quantum well growth temperature to avoid dissociation of InGaN quantum well. AlGaN grown at this temperature, which is not desirable for high quality AlGaN growth, is likely to suffer from poor crystal quality, in particular, high defect density. It should be noted that since the proposed devices have a greatly simplified epitaxial structure as compared to existing devices, the present invention can further improve the manufacturability of LEDs.

The concept of employing thin a p-type GaN layer in a semi-polar-oriented GaN-based LED to reduce its series-resistance, light absorption and better preserve the quality of InGaN quantum well is believed to be new. The concept of a semi-polar-oriented GaN-based LED containing no AlGaN electron-blocking layer to improve hole-carrier injection and the crystal quality of the LED epitaxial layers is also believed to be new.

REFERENCES

The following references are incorporated by reference herein.

1. http://www.engadget.com/2006/12/12/seoul-semiconductor-squeezes-240-lumens-into-brightest-led.
2. Appl. Phys. Lett., 69(27), pp. 4188-2190 (1996).
3. MRS Internet J. Nitride Semicond., Res. 3, (15) (1998).
4. Phys. Status Solidi B, 216(1), pp. 391-398 (1999).
5. J. Appl. Phys., 100, pp. 023522-023522-10 (2006).
6. Jpn. J. Appl. Phys., Part 2 34, L797 (1995)
7. Jpn. J. Appl. Phys., Part 2 37, L1358 (1998).
8. Nature, 406, pp. 865-868 (2000).
9. Jpn. J. Appl. Phys. 42, pp. L1039-1040 (2003).
10. Appl. Phys. Lett., 87, pp. 231110-231110-3 (2005).
11. Jpn. J. Appl. Phys., 45, pp. L904-L906 (2006).
12. J. Appl. Phys., 100, pp. 113109-113109-5 (2006).
13. Jpn. J. Appl. Phys., 46, pp. L154-L157 (2007).
14. Jpn. J. Appl. Phys., 46, pp. L129-L131 (2007).
15. Appl. Phys. Lett., 90, pp. 233504-233504-3 (2007).
16. Electronics Lett., 43. No. 15 (2007).
17. Phy. Status Solidi (RRL), 1, No. 4, pp. 162-164 (2007).
18. Jpn. J. Appl. Phys., 45, pp. L659-L662 (2006).
19. 'Light-Emitting Diodes' (2nd Edition), Cambridge, pp. 81-83.
20. Phys. Rev. B. 47. 2072 (1993).
21. Phys. Rev. B. 59. 10202 (1999).
22. Phy. Status Solidi C. 120, pp. 121-126 (2000).
23. "Thin p-type GaN and AlGaN Electron-blocking layer free Blue Semipolar (10-1-1) Nitride-based Light Emitting Diodes (LEDs)," by Hong Zhong, Anurag Tyagi, Makoto Saito, Kenji Fujito, James S. Speck, Steven P. DenBaars, and Shuji Nakamura, which manuscript is the Appendix of parent U.S. Provisional Application Ser. No. 61/111,642 filed on Nov. 5, 2008, by Hong Zhong, Anurag Tyagi, James S. Speck, Steven P. DenBaars, and Shuji Nakamura, entitled "THIN P-TYPE GALLIUM NITRIDE AND ALUMINUM GALLIUM NITRIDE ELECTRON-BLOCKING LAYER FREE GALLIUM NITRIDE-BASED LIGHT EMITTING DIODES," cited in the "Cross-Reference to Related Application" above.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An opto-electronic device, comprising:
   a light emitting diode (LED) comprised of one or more n-type layers deposited on or above a substrate, one or more active layers for emitting light deposited on or above the n-type layers, and one or more p-type layers deposited on or above the active layers;
   wherein the p-type layers, the n-type layers and the active layers are comprised of a semi-polar III-nitride material,
   wherein the p-type layers have a combined a thickness of 100 nm or less; and
   wherein the LED does not contain an AlGaN electron blocking layer.

2. The device of claim 1, wherein the p-type layers have a thickness of at most 50 nm.

3. The device of claim 1, wherein the active layers comprises one or more quantum well layers, each having a thickness of 4 nm or more.

4. The device of claim 1, wherein the active layers have a combined thickness and a composition sufficient to capture and confine electron-carriers in the active layers, thereby providing the function of an electron blocking layer.

5. The device of claim 4, wherein the active layers comprise one or more quantum well layers, each having the thickness and the composition sufficient to capture and confine electron-carriers in the active layers, thereby providing the function of the electron blocking layer.

6. The device of claim 5, wherein the quantum wells are InGaN quantum wells.

7. The device of claim 1, wherein the LED has a higher luminous efficiency, crystal quality, hole injection efficiency, lower series-resistance, operating voltage, and light absorption as compared to an LED with p-type layers having a combined thickness greater than 100 nm and containing an AlGaN blocking layer.

8. A method for fabricating an opto-electronic device, comprising:
fabricating a light emitting diode (LED) comprised of one or more n-type layers deposited on or above a substrate, one or more active layers for emitting light deposited on or above the n-type layers, and one or more p-type layers deposited on or above the active layers;
wherein the p-type layers, the n-type layers and the active layers are comprised of a semi-polar III-nitride material,
wherein the p-type layers have a combined a thickness of 100 nm or less, and
wherein the LED does not contain an AlGaN electron blocking layer.

9. The method of claim 8, wherein the p-type layers have a thickness of at most 50 nm.

10. The method of claim 8, wherein the active layers comprises one or more quantum well layers, each having a thickness of 4 nm or more.

11. The method of claim 8, wherein the active layers have a combined thickness and a composition sufficient to capture and confine electron-carriers in the active layers, thereby providing the function of an electron blocking layer.

12. The method of claim 11, wherein the active layers comprise one or more quantum well layers, each having the thickness and the composition sufficient to capture and confine electron-carriers in the active layers, thereby providing the function of the electron blocking layer.

13. The method of claim 12, wherein the quantum wells are InGaN quantum wells.

14. The method of claim 8, wherein the LED has a higher luminous efficiency, crystal quality, hole injection efficiency, lower series-resistance, operating voltage, and light absorption as compared to an LED with p-type layers having a combined thickness greater than 100 nm and containing an AlGaN blocking layer.

* * * * *